United States Patent [19]
Lynch, Jr. et al.

[11] 3,979,659
[45] Sept. 7, 1976

[54] AUTOMOTIVE ALTERNATOR RECTIFIER BRIDGES

[75] Inventors: Peter F. Lynch, Jr., Attleboro; Richard G. Delagi, Sharon, both of Mass.; Richard E. Haley, Plano, Tex.

[73] Assignee: Texas Instruments Incorporated, Dallas, Tex.

[22] Filed: Jan. 30, 1975

[21] Appl. No.: 545,644

[52] U.S. Cl. .............................. 321/8 R; 228/123; 228/205; 310/68 D
[51] Int. Cl.² ...................................... H02M 7/155
[58] Field of Search .................. 310/68 D; 321/8 R; 228/123, 208, 209, 205, 206

[56] References Cited
UNITED STATES PATENTS

| | | | |
|---|---|---|---|
| 2,691,815 | 10/1954 | Boessenkool et al. | 228/206 |
| 2,753,623 | 7/1956 | Boessenkool et al. | 228/205 |
| 3,684,944 | 8/1972 | Evgrafov et al. | 321/8 R |
| 3,786,556 | 1/1974 | Weston | 228/123 |
| 3,870,944 | 3/1975 | Ogawa et al. | 310/68 D |
| 3,895,247 | 7/1975 | Iwata et al. | 321/8 R |

*Primary Examiner*—Gerald Goldberg
*Attorney, Agent, or Firm*—John A. Haug; James P. McAndrews; Russell E. Baumann

[57] ABSTRACT

An automotive alternator rectifier bridge comprising a pair of generally flat heat-conducting laminated bases each having a central layer of aluminum with layers of copper bonded to the opposite surfaces thereof. A plurality of first diodes have their cathodes solder-connected to one surface of one of the bases. The anodes of a plurality of second diodes are solder-connected to one surface of the other of these bases. Each diode is constituted by a discrete semiconductor chip having a metallic layer in ohmic contact with one face thereof and each diode is secured to one of the bases by having its metallic layer soldered to the laminated base. Electrical conductors are solder-connected to the anodes of the first diodes and to the cathodes of said second diodes and extend generally parallel to the bases for connection to automotive alternator terminals. Methods of fabricating these bridges are also described.

9 Claims, 5 Drawing Figures

AUTOMOTIVE ALTERNATOR RECTIFIER BRIDGES

BACKGROUND OF THE INVENTION

This invention relates to automotive alternator rectifier bridges and the fabrication thereof.

The three-phase alternators now almost universally used in vehicular applications for generation of electrical power rely on a rectifier bridge circuit to provide relatively high current, low voltage direct current to the increasingly heavy electrical loads that must be supplied. These rectifier bridges generally employ three negative and three positive diode rectifiers mounted on respective brackets or bases as part of the alternator assembly. They must operate reliably for long periods of time in the hostile environment of the engine compartment of the vehicle where they must withstand wide extremes of temperature. Typically six silicon rectifier chips, each sealed and mounted in a metal can, have been mechanically secured or soldered to metal base members which serve as heat sinks for the dissipation of heat generated by the diodes during operation. These bases or brackets have been formed from solid copper or aluminum and nickel-plated steel and frequently include a heavy solid set of cast heat-radiating fins to maintain the operating temperature of the bridge within acceptable limits. These bridges have been relatively complex in structure, required rather extensive and costly fabrication procedures, and were, as a result, rather expensive.

SUMMARY OF THE INVENTION

Among the several objects of this invention may be noted the provision of automotive alternator rectifier bridges which have excellent heat dissipating characteristics and may be economically fabricated with relatively inexpensive components and the provision of methods of making such bridges which simplify assembly procedures and permit the use of discrete diode chips rather than requiring rectifier diode component packages or units.

Briefly, an automotive alternator rectifier bridge of this invention comprises a pair of generally flat heat-conducting laminated bases each having a central layer of aluminum with layers of copper bonded to the opposite surfaces thereof. A plurality of first diodes have their cathodes solder-connected to one surface of one of the bases. A plurality of second diodes have their anodes solder-connected to one surface of the other base. Each of the diodes is constituted by a discrete semiconductor chip having a metallic layer in ohmic contact with one face thereof. Electrical conductors are solder-connected to the anodes of the first diodes and to the cathodes of said second diodes and extend generally parallel to the bases for connection to automotive alternator terminals. Also in accordance with this invention automotive alternator bridges are fabricated by first forming a generally flat heat-conducting laminated base with a central layer of aluminum with layers of copper bonded to the opposite surfaces thereof with at least one of these copper layers having a layer of solder on its exposed surface. A plurality of diodes are then positioned on the base with the metallic layer of each diode in facial contact with the solder layer thereof. The base is then heated to a temperature sufficient to cause flow of the solder whereby upon cooling all diodes are simultaneously solder-connected to the base.

Other objects and features will be in part apparent and in part pointed out hereinafter.

BRIEF DESCRIPTION OF THE DRAWINGS

Corresponding reference characters indicate corresponding parts throughout the several views of the drawings.

DESCRIPTION OF PREFERRED EMBODIMENTS

Figure 1:
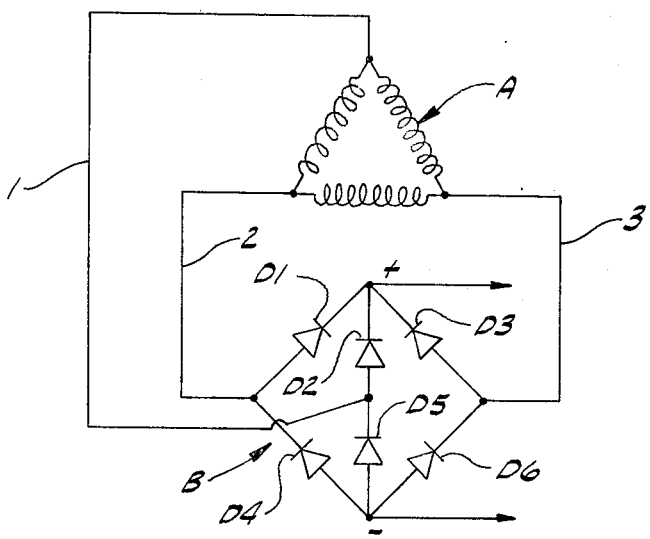
FIG. 1 is a circuit diagram of an automotive alternator rectifier bridge of this invention connected to a three-phase alternator.
Figure 2:
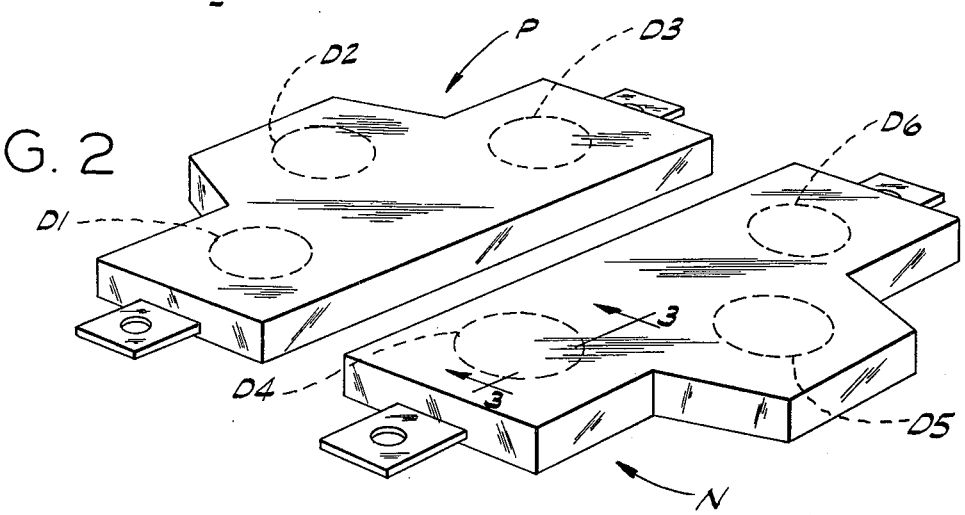
FIG. 2 is a trimetric view of a pair of subassemblies of an alternator bridge of this invention.

Referring now to the drawings and more particularly to FIG. 1, the stator windings which constitute the stationary armature of a conventional three-phase alternator, such as is used in automotive applications, are indicated generally at A. These stator windings are variably excited by a field coil rotor (not shown) the d.c. excitation of which is controlled by the customary solid-state regulator or controller as a function of the state of charge of the battery and the magnitude of the load. A three-phase alternator rectifier bridge B is supplied with three-phase a.c. power from the alternator stator windings by leads 1, 2 and 3. This bridge comprises three solid-state rectifier diodes, D1, D2 and D3 which have their cathodes commonly connected to the positive d.c. supply terminal of the bridge, and three similar solid-state rectifier diodes D4, D5 and D6 which have their anodes commonly connected to the negative d.c. supply terminal. These terminals are connected to the automotive d.c. distribution system to supply the many d.c. loads of the vehicle. Diodes D1–D3, frequently referred to as positive diodes, are mounted on one base to form one subassembly P while the other three diodes D4–D6 are mounted on another base to form a second subassembly N, as indicated in FIG. 2.

Figure 3:
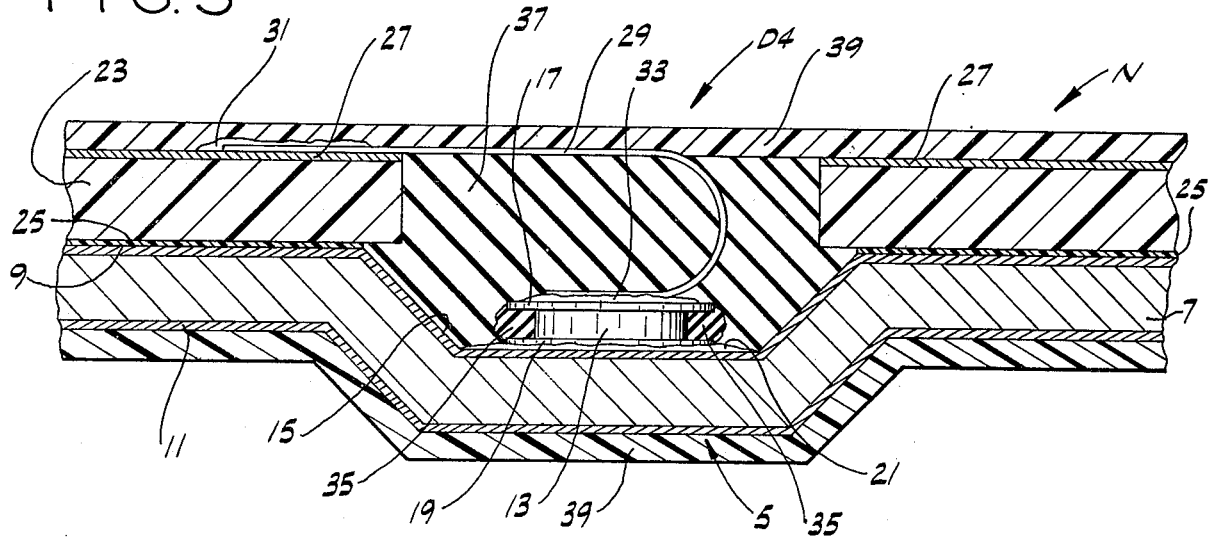
FIG. 3 is a cross section on line 3—3 of FIG. 2.
Figure 4:
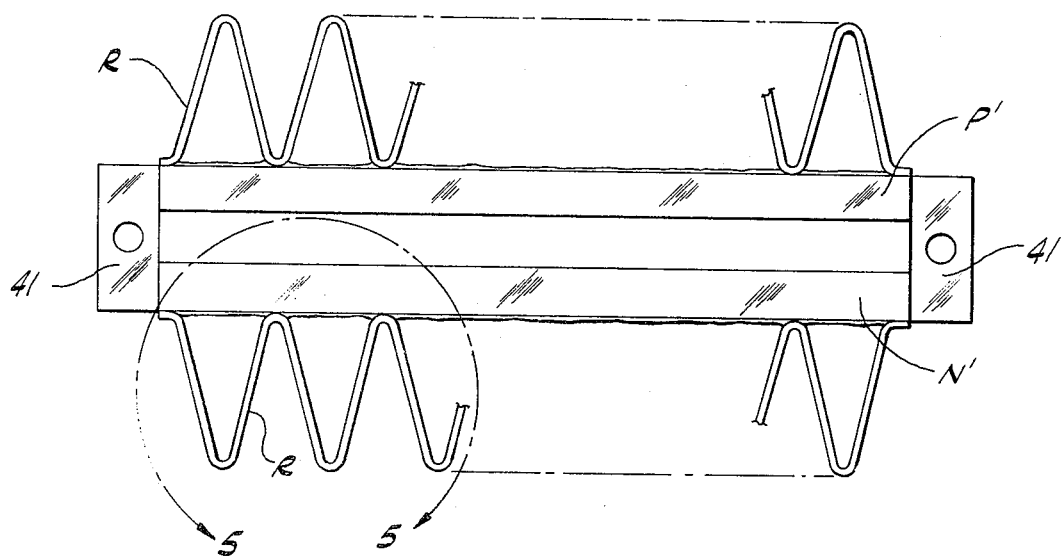
FIG. 4 is an elevation of another embodiment of an alternator bridge of this invention.

As illustrated in FIG. 3, subassembly N includes a base 5 of generally flat heat conducting laminated metal comprising a central layer 7 of aluminum clad on opposite surfaces with layers 9 and 11 of copper. The copper layers may be bonded to the aluminum core layer by any conventional process such as by solid phase bonding as decribed in U.S. Pat. Nos. 2,691,815 and 2,753,623. An exemplary base 5 is formed from laminated stock about .093 inch (.236 cm.) in thickness with aluminum layer 7 constituting 80% of the thickness and the copper layers each being about 10% thereof.

Diode D4, comprising a silicon semiconductor diode chip 13, is positioned in a slight depression or recess 15 of base 5. Chip 13 has an upper metallic layer 17 and a lower metallic layer 19, respectively, in ohmic contact with the opposite chip faces. These layers may be metal plates in electrical facial contact with the chip surfaces or they may be areas of a thin surface plating or coating of metal which also serves as a chip electrode. The lower layer 19 is the anode of this diode D4 and is solder-connected, as indicated at 21, to copper layer 9 of laminated base 5. A sheet 23 of rigid synthetic resin insulating material, such as formed of a phenolic resin, is bonded to the upper surface of base 5 by an epoxy adhesive or the like as indicated at 25. Insulating sheet or layer 23 has openings which generally align with depressions 15 and has a pattern of conductive paths 27 on its upper surface formed, for example, by an additive plating process such as is known as electroless plating. Conductive paths 27, typically formed of copper (e.g., .008 inch — .020 cm.), serve as electrical conductors to interconnect the cathodes of D4, D5, and D6 to the balance of the bridge components and the terminals of the alternator. Electrical interconnection between conductive path 27 and the cathode of D4 is accomplished by solder-connecting one end of a thin (e.g., .005 inch — .013 cm.) narrow (e.g., .14 inch — .36 cm.) strip 29 of copper to path 27 as indicated at 31 and soldering the other end thereof to the cathode electrode of D4 as indicated at 33. The edge portions of chip 13 are coated as shown at 35 with a synthetic resin material, such as a self-curing silicone rubber, commercially available under the trade designation RTV 112 from General Electric. A further infilling 37 of the same material is utilized to seal and encapsulate diode D4. Finally, the entire subassembly N is provided with protective coating 39 of a synthetic resin potting material, such as an epoxy resin.

It will be understood that the other diodes D5 and D6 are similarly mounted and provided with conductive paths on the surface of layer 23 to serve as electrical conductors extending generally parallel to base 5 so as to complete the fabrication of the negative diode subassembly N. Similarly, diodes D1, D2, and D3 are mounted in positive diode assembly P, except that the cathodes of each of these diodes are solder-connected to the laminated base of P.

Figure 5:
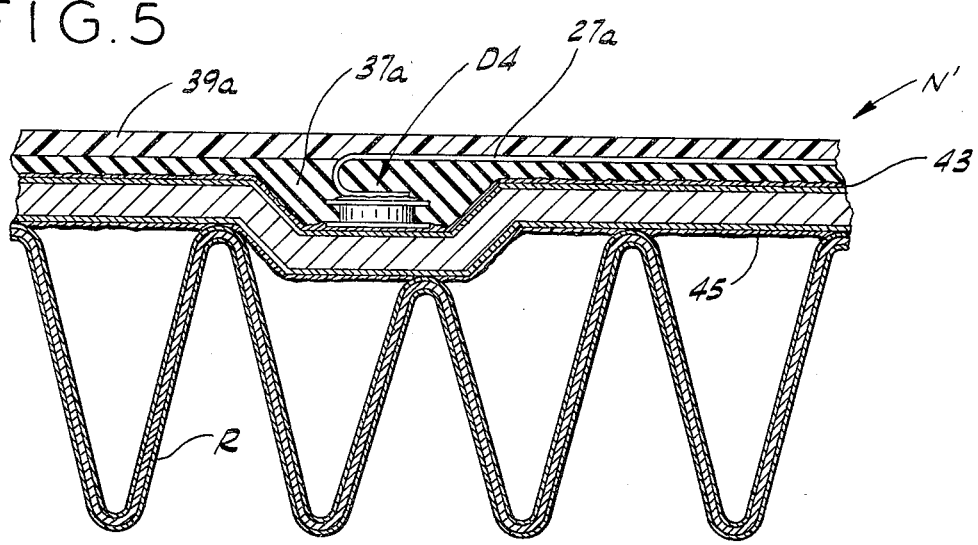
FIG. 5 is an enlarged partial cross section of the portion of alternator bridge of FIG. 4 shown encircled at 5—5.

Another embodiment of this invention is shown in FIG. 5. In this rectifier bridge both positive and negative diode subassemblies P' and N' are provided with heat-radiator members R. These radiators are of serpentine shape and formed from laminated composite metal sheet having a core of aluminum and surface layers of copper bonded to the opposite surfaces thereof, and thus are quite similar to the composite material used to fabricate base members 5, described above. Preferably, however, the radiators are formed of a relatively thinner material than the material of the base members. The subassemblies are held spaced apart by mounting brackets 41 thus permitting circulation of air therebetween and through the open convolutions of radiators R.

A modified form of composite base 5a is employed in this bridge as illustrated in FIG. 5. The copper-aluminum-copper laminate has surface layers 43 and 45 of solder and the cathode of diode D4 is interconnected to the other bridge components and the alternator leads by a flexible copper strip 27a which extends parallel to the plane of base 5a and lies on the surface of chip potting resin layer 37a which seals and encapsulates the discrete diode chips. A protective coating 39a of epoxy potting resin protects the upper surface of subassembly N'.

In accordance with this invention bridge portions N' and P' are formed by positioning three discrete diode chips on the composite metal base 5a with their appropriate electrodes in facial contact with solder layer 43 and concurrently bridging alternate convolutions of radiator R into contact with solder layer 45. With the components jigged in position, the assembly is heated sufficiently to effect flow of the solder. Upon cooling all the diodes are solder-connected to 5a and simultaneously the radiator R is secured to the other surface of base 5a. The potting resin layers 37a and 39a may then be sequentially applied to complete the fabrication of the alternator rectifier bridge subassemblies.

It will be understood that substantial savings are effected by using the discrete semiconductor chips directly mounted on the heat conductivity bases of this invention but that the chip diodes are well-protected in the bridges of this invention by the sealing and encapsulating resulting from the potting resin materials.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. An automotive alternator rectifier bridge comprising a pair of generally flat heat-conducting laminated bases each having a central layer of aluminum with layers of copper bonded to the opposite surfaces thereof, a plurality of first diodes each having its cathode solder-connected to one surface of one of the bases, a plurality of second diodes each having its anode solder-connected to one surface of the other of said bases, each of said diodes being constituted by a discrete semiconductor chip having a metallic layer in ohmic contact with one face thereof and each diode being secured to one of said bases by having its metallic layer soldered to the laminated base and electrical conductors solder-connected to the anodes of the first diodes and to the cathodes of said second diodes and extending generally parallel to the bases for connection to automotive alternator terminals.

2. A bridge as set forth in claim 1 wherein each base is provided with a plurality of recesses each having a diode chip positioned therein and secured to said base by being soldered to the laminated base.

3. A bridge as set forth in claim 2 in which the copper layer constituting the one surface of each base has a solder layer on its exposed face for securing of the diode metallic layers to said bases.

4. A bridge as set forth in claim 2 which includes a layer of synthetic resin potting material overlying the surface of each base on which said diode chips are mounted thereby encapsulating and sealing each chip.

5. A bridge as set forth in claim 1 which further includes a layer of rigid insulating material bonded to the one surface of each base, and wherein the conductors comprise conductive circuit paths formed on the exposed faces of these insulating layers.

6. A bridge as set forth in claim 1 in which the other surface of each base has a surface layer of solder and which further includes a heat radiator member of generally serpentine shape formed of heat-conducting laminated sheet material having a core of aluminum with layers of copper bonded to opposite surfaces thereof, alternate convolutions of said radiator member being solder-connected to the other surface of said base plate.

7. A bridge as set forth in claim 6 in which both copper layers of each base have surface layers of solder.

8. A bridge as set forth in claim 4 wherein each electrical conductor lies on the surface of said potting resin layer, and another layer of potting resin overlies the first potting material layer and the electrical conductors.

9. A bridge as set forth in claim 8 which further includes another layer of synthetic resin potting material overlying the other surface of each base.

* * * * *